United States Patent
Wu et al.

(10) Patent No.: US 9,543,896 B2
(45) Date of Patent: *Jan. 10, 2017

(54) MULTIPLE-INPUT MULTIPLE-OUTPUT LOW-NOISE BLOCK DOWNCONVERTER AND LOW-NOISE MODULE

(71) Applicant: RichWave Technology Corp., Taipei (TW)

(72) Inventors: Hsin-Ta Wu, Taipei (TW); Jui-Yu Chang, Taipei (TW); Jau-Jr Lin, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/981,943

(22) Filed: Dec. 29, 2015

(65) Prior Publication Data

US 2016/0112007 A1    Apr. 21, 2016

Related U.S. Application Data

(63) Continuation of application No. 13/421,872, filed on Mar. 16, 2012, now Pat. No. 9,258,072.

(30) Foreign Application Priority Data

Sep. 19, 2011 (TW) .............................. 100133598 A (51) Int. Cl.
| | | |
|---|---|---|
| *H04L 27/00* | (2006.01) | |
| *H03D 7/14* | (2006.01) | |
| *H04B 1/06* | (2006.01) | |
| *H04H 40/90* | (2008.01) | |
| *H04B 1/16* | (2006.01) | |
| *H04B 7/04* | (2006.01) | |

(52) U.S. Cl.
CPC .................. *H03D 7/14* (2013.01); *H04B 1/06* (2013.01); *H04B 1/16* (2013.01); *H04H 40/90* (2013.01); *H04B 7/0452* (2013.01); *H04L 27/00* (2013.01)

(58) Field of Classification Search
USPC ........................................ 375/267, 260, 259
See application file for complete search history.

(56) References Cited

U.S. PATENT DOCUMENTS

| | | |
|---|---|---|
| 6,011,597 A | 1/2000 | Kubo |
| 6,344,832 B1 | 2/2002 | Lotfy |
| 9,258,072 B2 * | 2/2016 | Wu .......................... H03D 7/14 |

(Continued)

FOREIGN PATENT DOCUMENTS

| | | | |
|---|---|---|---|
| EP | 0 851 574 A1 | 7/1998 | |
| JP | EP 0851574 A1 * | 7/1998 | ............. H03D 7/165 |

*Primary Examiner* — Kevin M Burd
(74) *Attorney, Agent, or Firm* — Winston Hsu; Scott Margo (57) ABSTRACT

A low-noise block downconverter (LNB) is disclosed. The low-noise block downconverter comprises a first input module, for outputting a first intermediate frequency (IF) signal after receiving a first polarization signal via a first input end; a second input module, for outputting a second IF signal after receiving a second polarization signal via a second input end; a first output module, coupled to the first input module, for amplifying the first IF signal; and a second output module, coupled to the second input module, for amplifying the second IF signal, such that the LNB selectively outputs a first user signal or a second user signal.

19 Claims, 6 Drawing Sheets

(56) References Cited

U.S. PATENT DOCUMENTS

| | | | |
|---|---|---|---|
| 2007/0111661 A1* | 5/2007 | Bargroff | H03D 7/00 455/13.3 |
| 2009/0102706 A1 | 4/2009 | Goldblatt | |
| 2009/0323582 A1 | 12/2009 | Proctor, Jr. | |
| 2012/0189084 A1 | 7/2012 | Yu | |
| 2013/0084821 A1* | 4/2013 | Kapoor | H04B 1/1036 455/307 |

* cited by examiner

MULTIPLE-INPUT MULTIPLE-OUTPUT LOW-NOISE BLOCK DOWNCONVERTER AND LOW-NOISE MODULE

CROSS REFERENCE TO RELATED APPLICATION

This is a continuation application of U.S. application Ser. No. 13/421,872 filed on Mar. 16, 2012 and entitled "Multiple-Input Multiple-Output Low-Noise Block Downconverter and Low-Noise Module", which is included in its entirety herein by reference.

TECHNICAL FIELD

The present invention relates to a multiple-input multiple-output (MIMO) low-noise block downconverter and a MIMO low-noise block module, and more particularly, a MIMO low-noise block downconverter and a MIMO low-noise block module are capable of providing a plurality of polarization signals to a plurality of users according to choices of the plurality of users.

BACKGROUND

Satellite communication has several advantages, such as a wide coverage, low terrestrial interference, etc., and has been applied to many areas such as television broadcasting and wireless communication. Further, satellite signals can be received regardless of a position (e.g. a city without infrastructure, ocean or desert) of a receiver, as long as receiving antennas of the receiver are properly configured.

Figure 1:
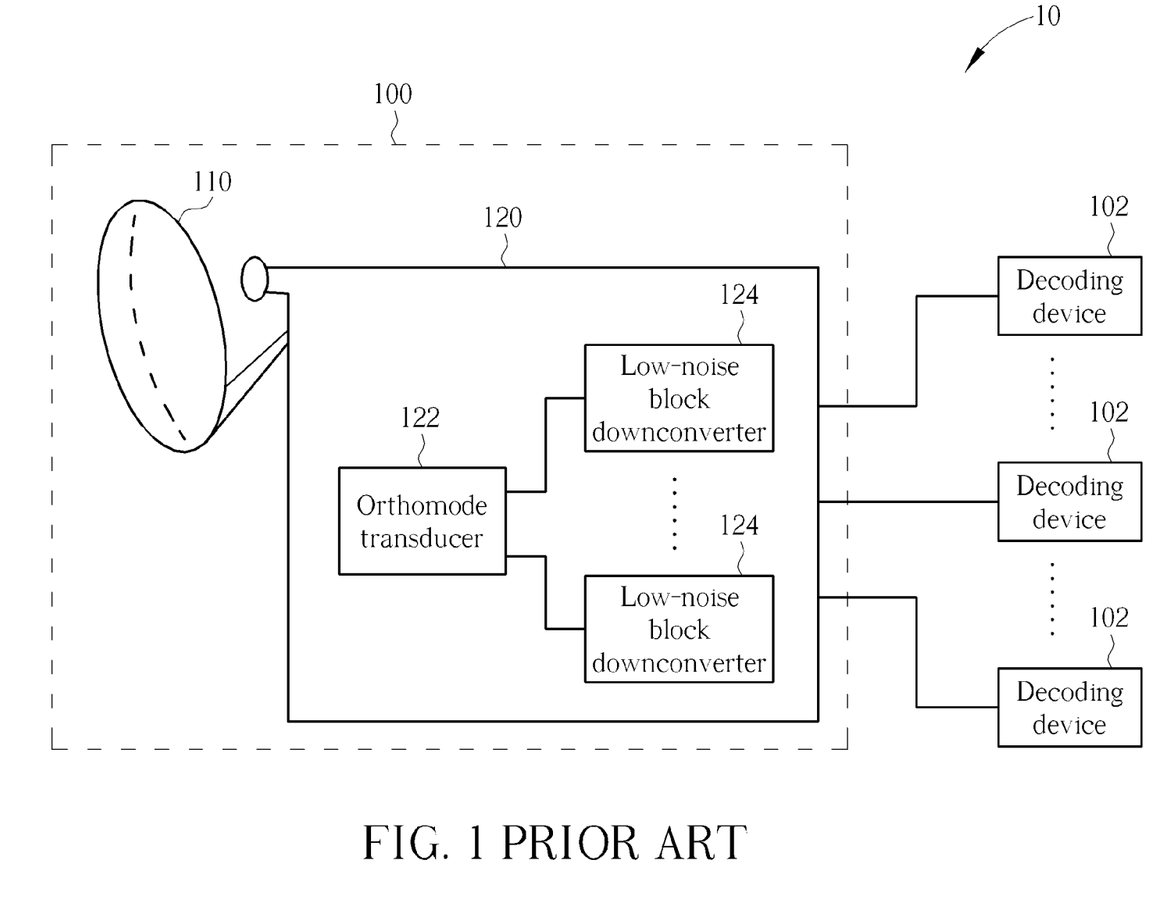
FIG. 1 is a schematic diagram of a satellite broadcasting system according to the prior art.

Please refer to FIG. 1, which is a schematic diagram of a satellite broadcasting system 10 according to an example of the prior art. The satellite broadcasting system 10 is suitable for a family, a building or a community. Each user in the family, the building or the community can receive satellite signals, such as Ku band (10.7-12.75 GHz) satellite signals, through a master antenna. In the satellite broadcasting system 10, a satellite receiver 100 receives the satellite signals, and down-converts frequency bands of the satellite signals to generate corresponding intermediate frequency (IF) signals with a frequency band of 0.95-2.15 GHz. Then, the IF signals are transmitted to a decoding device 102 (e.g. a set-top box) of each user, for decoding the IF signals. Thus, each user in the family, the building or the community can watch satellite broadcasting programs via various playback devices, such as a television and a computer.

In detail, a satellite receiver 100 comprises a satellite dish 110 and a low-noise block downconverter with feedhorn (LNBF) 120. Further, the LNBF 120 comprises an orthomode transducer (OMT) 122 and multiple low-noise block downconverters (LNBs) 124. After the LNBF 120 receives satellite signals via the satellite dish 110, the orthomode transducer 122 divides the satellite signals into vertical polarization signals and horizontal polarization signals which are outputted to the multiple low-noise block downconverters 124. Besides, the polarization signals can be further divided into high-band (HB) polarization signals and low-band (LB) polarization signals according to frequency bands of the polarization signals. That is, the polarization signals can be divided into LB horizontal polarization signals, HB horizontal polarization signals, LB vertical polarization signals and HB vertical polarization signals. After the low-noise block downconverter down-converts the frequency bands of the four types of the polarization signals to the intermediate frequency of 0.95-2.15 GHz, one of the four types of the polarization signals is outputted to the decoding device 102 of the user according to the choice of the user.

However, since choices of the users are usually different, a number of the low-noise block downconverters 124 should be proportional to a number of types of the polarization signals and a number of the users, to provide different IF signals to the users according to the choices of the users. For example, each user occupies four low-noise block downconverters 124 of the LNBF 120, such that the each user can freely choose one of the four types of the polarization signals. Therefore, when the number of the users is large, a large number of the low-noise block downconverters 124 must be installed in the LNBF 120 for serving the users. Both cost and power consumption of the satellite receiver 100 increase accordingly. Thus, how to raise the number of the polarization signals and the number of the users that a single low-noise block downconverter can serve is an important topic to be discussed.

SUMMARY

The present invention therefore provides a MIMO low-noise block downconverter and a MIMO low-noise block module to solve the above-mentioned problems.

A low-noise block downconverter (LNB) is disclosed. The low-noise block downconverter comprises a first input module, for outputting a first intermediate frequency (IF) signal; a second input module, for outputting a second IF signal; a first output module, coupled to the first input module, for amplifying the first IF signal, to output a first user signal to a first user; a second output module, coupled to the second input module, for amplifying the second IF signal, to output a second user signal to a second user; a first input end, coupled to the first input module, for receiving a first polarization signal; and a second input end, coupled to the second input module, for receiving a second polarization signal; wherein a first signal path comprising a first switch and a second signal path comprising a second switch, the first switch is coupled between a first IF amplifier of the first output module and a second output stage of the second output module, a second switch is coupled between a second IF amplifier of the second output module and a first output stage of the first output module; wherein the first input module further comprises a first oscillator, coupled to a first mixer, for generating a first oscillation signal with a first frequency and a second frequency selectively, and the second input module further comprises a second oscillator, coupled to a second mixer, for generating a second oscillation signal with the first frequency and the second frequency selectively; wherein the first mixer selectively outputs a first mixing signal at an IF band after receiving the first polarization signal and the first oscillation signal with the first frequency, and a second mixing signal at the IF band after receiving the first polarization signal and the first oscillation signal with the second frequency; the second mixer selectively outputs a third mixing signal at the IF band after receiving the second polarization signal and the second oscillation signal with the first frequency, and a fourth mixing signal at the IF band after receiving the second polarization signal and the second oscillation signal with the second frequency; wherein the first IF amplifier selectively receives one of the first mixing signal and the second mixing signal to output a first output signal, the second IF amplifier selectively receives one of the third mixing signal and the fourth mixing signal to output a second output signal, the first output stage selectively receives the first output signal and the second output signal to output the first user signal, and the second output stage selectively receives the first output signal and the second output signal to output the second user signal; wherein the LNB outputs the first user signal and the second user signal simultaneously; and wherein the first user signal relates to one of the first mixing signal, the second mixing signal, the third mixing signal and the fourth mixing signal, and the second user signal relates to one of the first mixing signal, the second mixing signal, the third mixing signal and the fourth mixing signal.

A low-noise block module is disclosed. The low-noise block module comprises a low-noise block downconverter (LNB) and a control unit. The low-noise block downconverter comprises a first input module, for outputting a first intermediate frequency (IF) signal; a second input module, for outputting a second IF signal; a first output module, coupled to the first input module via a first connection node, for amplifying the first IF signal, to output a first user signal to a first user; a second output module, coupled to the second input module via a second connection node, for amplifying the second IF signal, to output a second user signal to a second user; a first input end, coupled to the first input module, for receiving a first polarization signal; and a second input end, coupled to the second input module, for receiving a second polarization signal; wherein a first signal path comprising a first switch and a second signal path comprising a second switch, the first switch is coupled between a first IF amplifier of the first output module and a second output stage of the second output module, a second switch is coupled between a second IF amplifier of the second output module and a first output stage of the first output module; wherein the first input module further comprises a first oscillator, coupled to a first mixer, for generating a first oscillation signal with a first frequency and a second frequency selectively, and the second input module further comprises a second oscillator, coupled to a second mixer, for generating a second oscillation signal with the first frequency and the second frequency selectively; wherein the first mixer selectively outputs a first mixing signal at an IF band after receiving the first polarization signal and the first oscillation signal with the first frequency, and a second mixing signal at the IF band after receiving the first polarization signal and the first oscillation signal with the second frequency; the second mixer selectively outputs a third mixing signal at the IF band after receiving the second polarization signal and the second oscillation signal with the first frequency, and a fourth mixing signal at the IF band after receiving the second polarization signal and the second oscillation signal with the second frequency; wherein the first IF amplifier selectively receives one of the first mixing signal and the second mixing signal to output a first output signal, the second IF amplifier selectively receives one of the third mixing signal and the fourth mixing signal to output a second output signal, the first output stage selectively receives the first output signal and the second output signal to output the first user signal, and the second output stage selectively receives the first output signal and the second output signal to output the second user signal; wherein the LNB outputs the first user signal and the second user signal simultaneously; and wherein the first user signal relates to one of the first mixing signal, the second mixing signal, the third mixing signal and the fourth mixing signal, and the second user signal relates to one of the first mixing signal, the second mixing signal, the third mixing signal and the fourth mixing signal. The control unit is used for generating a control signal to the low-noise block downconverter according to inputs of the first user and the second user, to control conducting states of the first signal path and the second signal path, and operations of the first input module, the second input module, the first output module and the second output module, to reduce power consumption of the low-noise block downconverter.

A low-noise block downconverter (LNB) is disclosed. The low-noise block downconverter comprises a first input module, for outputting a first intermediate frequency (IF) signal; a second input module, for outputting a second IF signal; a first output module, coupled to the first input module, for amplifying the first IF signal, to output a first user signal to a first user; a second output module, coupled to the second input module, for amplifying the second IF signal, to output a second user signal to a second user; a first input end, coupled to the first input module, for receiving a first polarization signal; and a second input end, coupled to the second input module, for receiving a second polarization signal; wherein a first signal path comprising a first switch and a second signal path comprising a second switch are coupled between the first input module and the second input module, the second switch is coupled to between the second input end and an input end of a first mixer of the first input module, and the first switch is coupled to between the first input end and an input end of a second mixer of the second input module, the first user signal relates to the first polarization signal or the second polarization signal, and the second user signal relates to the first polarization signal or the second polarization signal; wherein the first input module outputs the first IF signal after receiving one of the first polarization signal via the first input end of the LNB and the second polarization signal via the second signal path selectively, and the second input module outputs the second IF signal after receiving one of the second polarization signal via the second input end of the LNB and the first polarization signal via the first signal path selectively; wherein the LNB outputs the first user signal and the second user signal simultaneously; wherein the first input module further comprises a first oscillator, coupled to the first mixer, for generating a first oscillation signal with at least one of a first frequency and a second frequency selectively, and the second input module further comprises a second oscillator, coupled to the second mixer, for generating a second oscillation signal with at least one of the first frequency and the second frequency selectively; wherein the first mixer selectively outputs a first mixing signal at an IF band after receiving the first polarization signal and the first oscillation signal with the first frequency, a second mixing signal at the IF band after receiving the first polarization signal and the first oscillation signal with the second frequency, a third mixing signal at the IF band after receiving the second polarization signal and the first oscillation signal with the first frequency, and a fourth mixing signal at the IF band after receiving the second polarization signal and the first oscillation signal with the second frequency; the second mixer selectively outputs the first mixing signal at the IF band after receiving the first polarization signal and the second oscillation signal with the first frequency, the second mixing signal at the IF band after receiving the first polarization signal and the second oscillation signal with the second frequency, the third mixing signal at the IF band after receiving the second polarization signal and the second oscillation signal with the first frequency, and the fourth mixing signal at the IF band after receiving the second polarization signal and the second oscillation signal with the second frequency; and wherein the first IF signal comprises one of the first mixing signal, the second mixing signal, the third mixing signal, and the fourth mixing signal; and the second IF signal comprises one of the first mixing signal, the second mixing signal, the third mixing signal, and the fourth mixing signal.

These and other objectives of the present invention will no doubt become obvious to those of ordinary skill in the art after reading the following detailed description of the preferred embodiment that is illustrated in the various figures and drawings.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
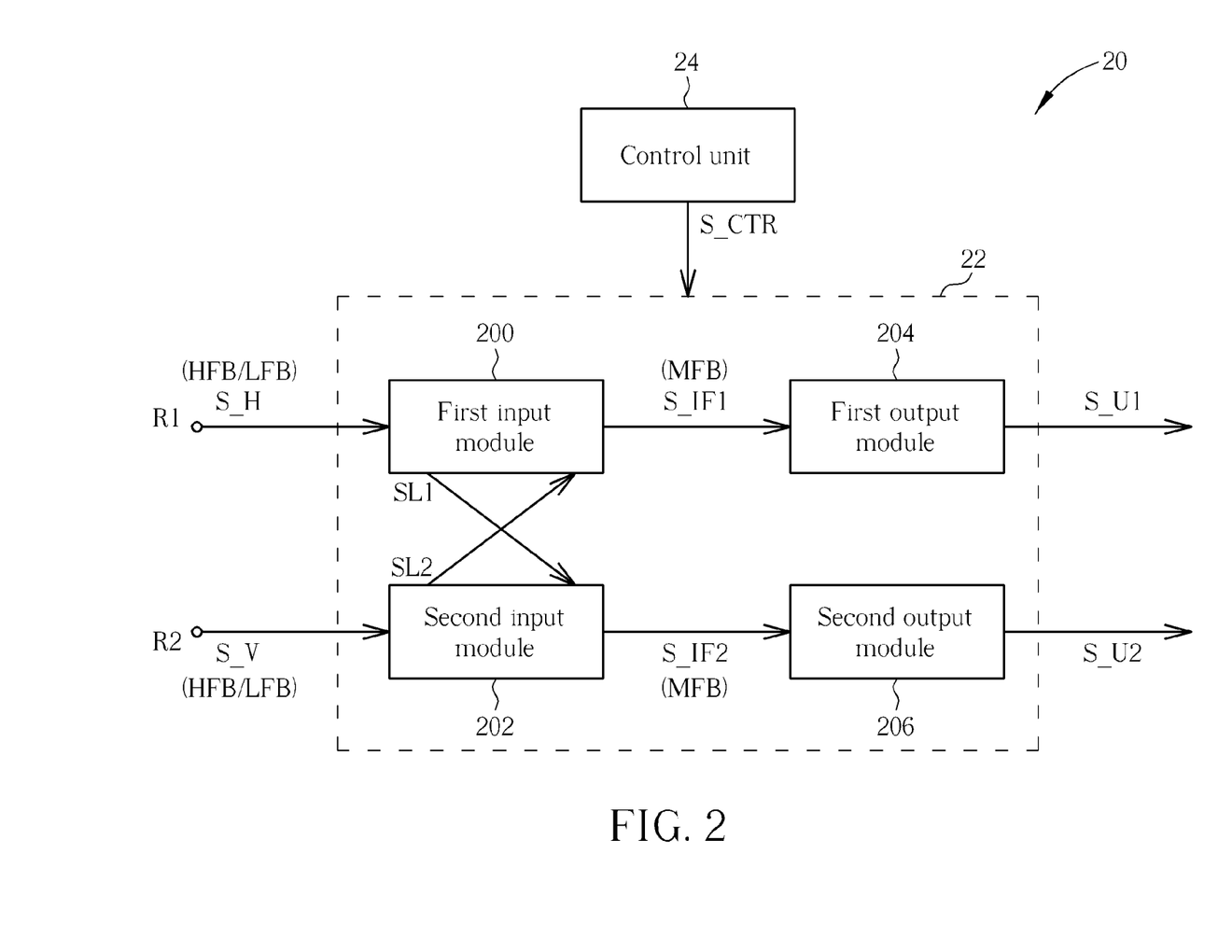
FIG. 2 is a schematic diagram of a low-noise block module according to an example of the present invention.

Please refer to FIG. 2, which is a schematic diagram of a low-noise block module 20 according to an example of the present invention. The low-noise block module 20 is used in a satellite broadcasting system, and includes a low-noise block downconverter (LNB) 22, a control unit 24, an input end R1 and an input end R2. The low-noise block downconverter 22 is used for receiving a horizontal polarization signal S_H and a vertical polarization signal S_V via the input end R1 and the input end R2, respectively. The horizontal polarization signal S_H and the vertical polarization signal S_V are so-called satellite signals transmitted on the Ku band (10.7-12.75 GHz). The control unit 24 generates a control signal S_CTR, for controlling the low-noise block downconverter 22 to process the horizontal polarization signal S_H and the vertical polarization signal S_V. The processing includes down-converting frequency bands of the horizontal polarization signal S_H and the vertical polarization signal S_V to an intermediate frequency (IF), generating corresponding IF signals and outputting user signals S_U1 and S_U2 to two users. In short, the low-noise block module 20 is a multiple-input multiple-out (MIMO) low-noise block module capable of receiving multiple polarization signals and generating corresponding user signals according to choices of the users.

Further, low-noise block downconverter 22 includes a first input module 200, a second input module 202, a first output module 204, a second output module 206, a signal path SL1 and a signal path SL2. The first input module 200 and the second input module 202 receive the horizontal polarization signal S_H and the vertical polarization signal S_V via the input ends R1 and R2, respectively. Then, the first input module 200 and the second input module 202 amplify the horizontal polarization signal S_H and the vertical polarization signal S_V, down-convert frequency bands of the horizontal polarization signal S_H and the vertical polarization signal S_V, and generate corresponding IF signals S_IF1 and S_IF2 to the first output module 204 and second output module 206, respectively. Besides, whether the frequency bands of the horizontal polarization signal S_H and the vertical polarization signal S_V are at a high band (e.g. 11.55-12.75 GHz) HFB or a low band (e.g. 10.7-11.9 GHz) LFB, the first input module 200 and the second input module 202 can down-convert the frequency bands to the same IF band (e.g. 0.95-2.15 GHz) MFB by properly mixing the horizontal polarization signal S_H and the vertical polarization signal S_V. The first output module 204 and the second output module 206 amplify the IF signal S_IF1 and S_IF2, respectively, and generate the corresponding user signals S_U1 and S_U2 to drive an output impedance. Thus, each of the two users can freely watch satellite broadcasting programs according to his choice.

Besides, signals received or processed by the first input module 200 are outputted to the second input module 202 via the signal path SL1; signals received or processed by the second input module 202 are outputted to the first input module 200 via the signal path SL2. In short, the signals processed by the first input module 200 and the second input module 202 are not limited to respectively received polarization signals (e.g. the horizontal polarization signal S_H and the vertical polarization signal S_V) by using the signal paths SL1 and SL2 coupled between the first input module 200 and the second input module 202.

Therefore, no matter which of low-band (LB) horizontal polarization signal, high-band (HB) horizontal polarization signal, LB vertical polarization signals and HB vertical polarization signal are chosen by the two users, the control unit 24 can generate the control signal S_CTR, for controlling conducting states of the signal paths SL1 and SL2, and controlling the first input module 200 and the second input module 202 to down-convert frequency bands of the horizontal polarization signal S_H and the vertical polarization signal S_V to the intermediate frequency. Then, the corresponding IF signals are generated and outputted to the first output module 204 and the second output module 206. In the prior art, four pairs of input/output modules are required in a satellite receiver for providing four types of the polarization signals to a single user, i.e., eight pairs of the input/output modules are required for two users. In comparison, only two pairs of the input/output modules are required in the present invention for providing the four types of the polarization signals to each of the two users. Therefore, both cost and power consumption of the satellite receiver is reduced.

Please note that, the spirit of the present invention is to control the conducting states of the signal paths SL1 and SL2, and control the first input module 200 and the second input module 202 to properly mix and process the polarization signals, such that the two users can freely choose either type of the polarization signals. Connections of the signal paths SL1 and SL2, and realizations of the first input module 200 and the second input module 202 are not limited, as long as the above-mentioned features are realized. For example, please refer to FIG. 3, which is a schematic diagram of a low-noise block downconverter 30 according to an example of the present invention. The low-noise block downconverter 30 is used for realizing the low-noise block downconverter 22 shown in FIG. 2, and includes a first input module 300, a second input module 310, a first output module 320 and a second output module 330. Further, the first input module 300 includes a low-noise amplifier (LNA) 302, an oscillator 304 and a mixer 306; the second input module 310 includes a low-noise amplifier 312, an oscillator 314 and a mixer 316. The oscillators 304 and 314 can generate a low oscillation frequency signal with an oscillation frequency F1 (e.g. 9.75 GHz) and a high oscillation frequency signal with an oscillation frequency F2 (e.g. 10.6 GHz). The first output module 320 includes an IF amplifier 322 and an output buffer 324; the second output module 330 includes an IF amplifier 332 and an output buffer 334. Besides, the signal path SL1 is coupled between the input end R1 and the low-noise amplifier 312, and the conducting state of the signal path SL1 is controlled by the switch SW1; the signal path SL2 is coupled between the input end R2 and the low-noise amplifier 302, and the conducting state of the signal path SL2 is controlled by the switch SW2.

Figure 3:
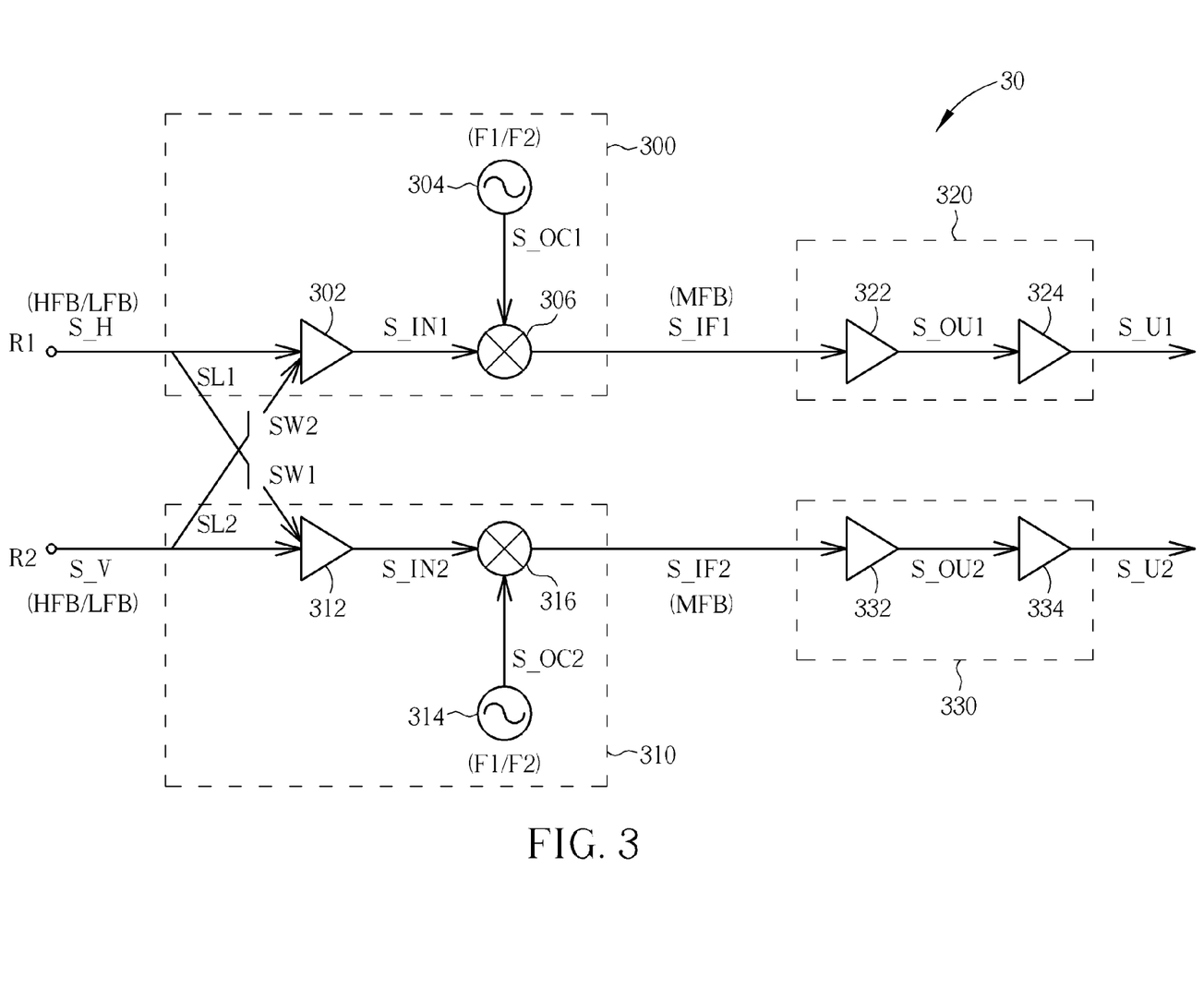
FIG. 3 is a schematic diagram of a low-noise block downconverter according to an example of the present invention.
Figure 4:
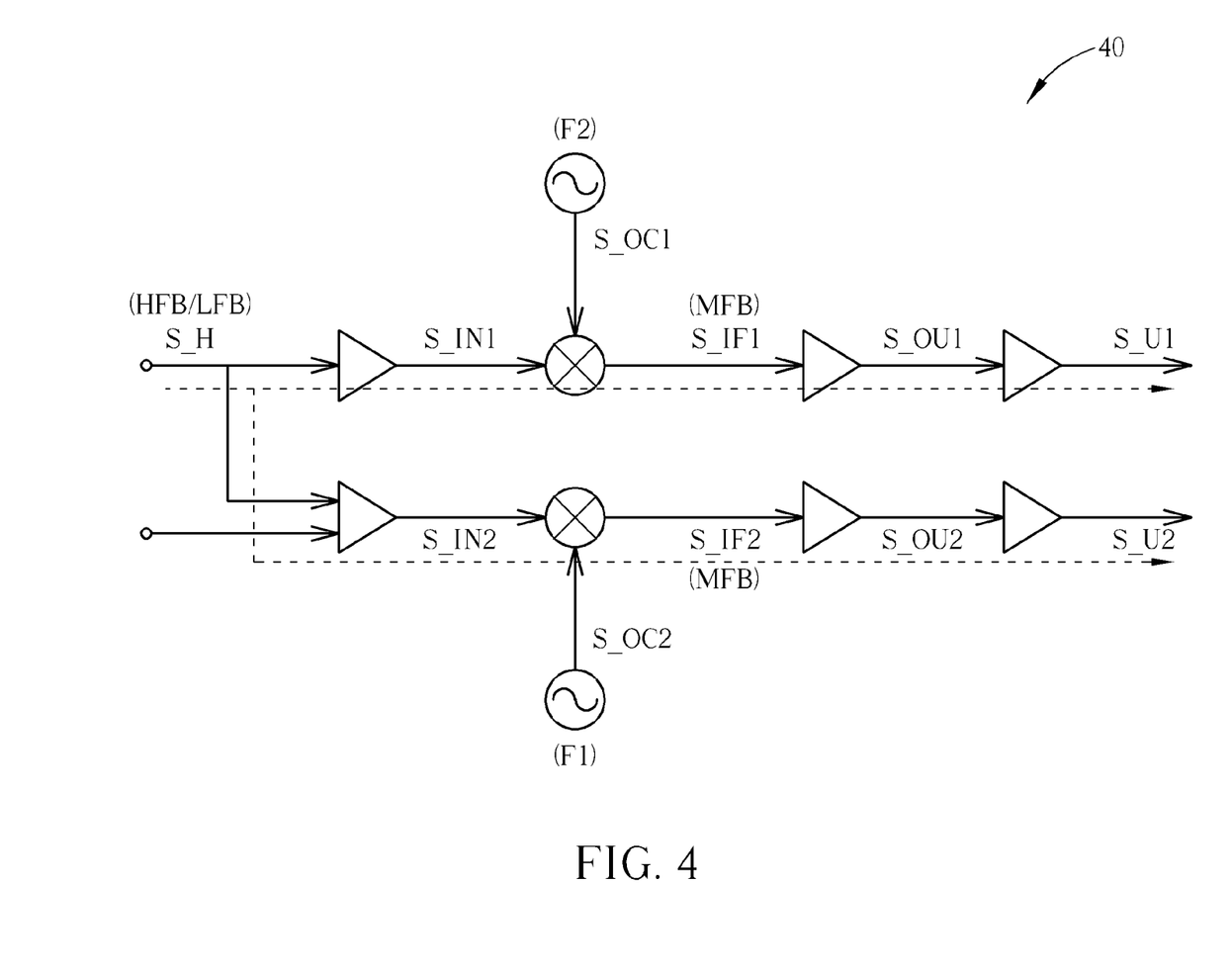
FIG. 4 is a schematic diagram of operations of the low-noise block downconverter shown in FIG. 3.

In detail, for example, the two users choose the HB horizontal polarization signal and the LB horizontal polarization signal, respectively. The control unit 24 generates the control signal S_CTR, for controlling the switch SW1 closed and the switch SW2 open. In this situation, the low-noise amplifier 302 receives the horizontal polarization signal S_H via the input end R1, amplifies the horizontal polarization signal S_H, and correspondingly generates an input signal S_IN1. Similarly, the low-noise amplifier 312 receives the horizontal polarization signal S_H via the input end R1 and the signal path SL1, amplifies the horizontal polarization signal S_H, and correspondingly generates an input signal S_IN2. Besides, since the two users choose the HB horizontal polarization signal and the LB horizontal polarization signal, respectively, the control signal S_CTR also controls the oscillator 304 to generate an oscillation signal S_OC1 with the oscillation frequency F2, and controls the oscillator 314 to generate an oscillation signal S_OC2 with the oscillation frequency F1. Then, the first input module 300 and the second input module 310 output the IF signals at the same IF band MFB. Therefore, after the input signals S_IN1 and S_IN2 are processed by the mixers 306 and 316, respectively, the first input module 300 outputs the IF signal S_IF1 at the IF band MFB to the first output module 320 and the second input module 310 outputs the IF signal S_IF2 at the IF band MFB to the second output module 330. In other words, the control signal S_CTR adjusts the oscillation frequencies of the oscillation signals, for outputting the IF signals at the same IF band MFB. Then, the IF amplifier 322 amplifies the IF signal S_IF1, and correspondingly generates an output signal S_OU1 to the output buffer 324. The output buffer 324 amplifies the output signal S_OU1 for driving the output impedance, and correspondingly generates the user signal S_U1 to the first user such that the first user can watch the chosen satellite broadcasting program. Similarly, the IF amplifier 332 amplifies the IF signal S_IF2, and correspondingly generates an output signal S_OU2 to the output buffer 334. The output buffer 334 amplifies the output signal S_OU2 for driving the output impedance, and correspondingly generates the user signal S_U2 to the second user such that the second user can watch the chosen satellite broadcasting program. For ease of illustration, please refer to FIG. 4, which is a schematic diagram of a low-noise block downconverter 40 according to an example of the present invention. The low-noise block downconverter 40 is used for illustrating operations of the low-noise block downconverter 30 shown in FIG. 3, for example, the corresponding responses of elements and changes of the signal paths after receiving the control signal S_CTR. Elements shown in FIG. 4 are respectively the same as those shown in FIG. 3, and are not narrated herein.

As can be seen from the above, the control unit 24 generates the control signal S_CTR according to the choices of the two users, for controlling the switches SW1 and SW2 to control the conducting states of the signal paths SL1 and SL2, respectively, to provide the signal paths required for transmitting the polarization signals. Besides, the control unit 24 controls the oscillators to generate the oscillation frequencies corresponding to the frequency bands of the polarization signals chosen by the two users, such that the frequency bands of the polarization signals are down-converted to the IF band MFB by the oscillation signals. Then, the IF signals are outputted to the corresponding output modules. Please note that, the above example illustrates that the two users choose the HB horizontal polarization signal and the LB horizontal polarization signal, respectively. In practice, the two users can freely choose any of the LB horizontal polarization signal, the HB horizontal polarization signal, the LB vertical polarization signals and the HB vertical polarization signal. Therefore, the present invention provides the four types of the polarization signals to each of the two users by using two pairs of the input/output modules and the two signal paths. That is, 16 combinations of the polarization signals are provided to the two users, which greatly enhance the use efficiency of the low-noise block downconverters. In comparison, the four pairs of the input/output modules are required in the prior art for providing four types of the polarization signals to a single user. That is, eight pairs of the input/output modules are required in the prior art for providing four types of the polarization signals to the two users. Therefore, the present invention reduces both the cost and the power consumption of the satellite receiver and the low-noise block downconverter 30.

Besides, the elements such as amplifiers and buffers in the low-noise block downconverter 30 of FIG. 3 are simply used for illustrating allocations of corresponding types of the elements. In practice, a number of the same type of the elements can be increased at the same position according to system requirement. For example, the low-noise amplifier 302 of the first input module 300 can be replaced by multiple low-noise amplifiers, which are the same type of the low-noise amplifier 302. On the other hand, additional amplifiers can also be placed on the signal paths SL1 and SL2 for compensating the path loss coming from long routing traces of the signal paths SL1 and SL2. Thus, the quality of the received polarization signals can meet the system requirement for successive signal processing. Realizations and statements mentioned above are ordinary skills in the art. Thus, those skilled in the art should make various alterations and modifications according to system requirement, and is not limited herein.

On the other hand, the present invention further adds a pair of signal paths between the two output modules based on the low-noise block module 20, such that the cost and the power consumption of the satellite receiver and the low-noise block downconverter can be further reduced while the two users can freely chose the polarization signals.

Figure 5:
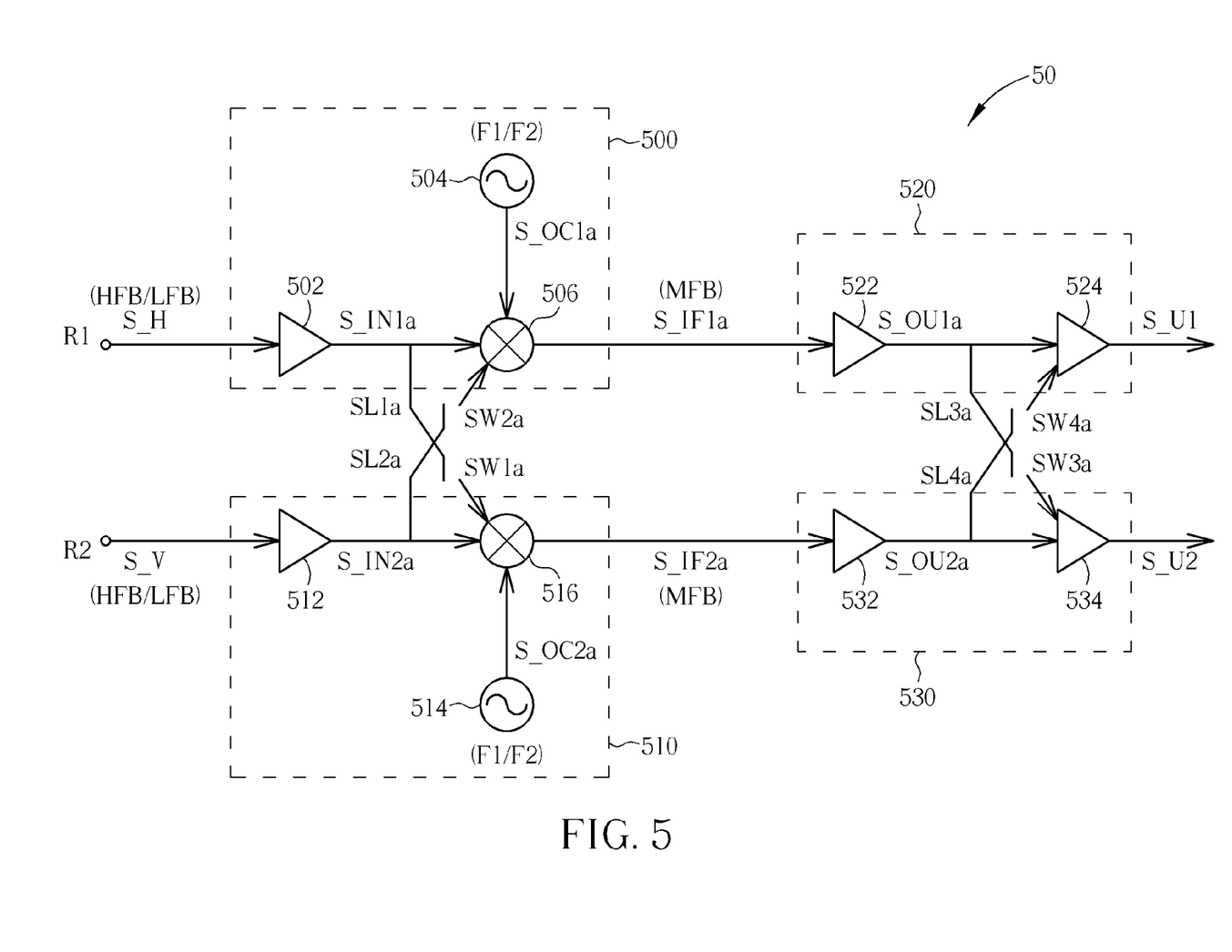
FIG. 5 is a schematic diagram of a low-noise block downconverter according to an example of the present invention.

Please refer to FIG. 5, which is a schematic diagram of a low-noise block downconverter 50 according to an example of the present invention. The low-noise block downconverter 50 is used for realizing the low-noise block downconverter 22 shown in FIG. 2, and includes a first input module 500, a second input module 510, a first output module 520 and a second output module 530. Further, the first input module 500 includes a low-noise amplifier 502, an oscillator 504 and a mixer 506; the second input module 510 includes a low-noise amplifier 512, an oscillator 514 and a mixer 516. The oscillators 504 and 514 generate a low oscillation frequency signal with an oscillation frequency F1 (e.g. 9.75 GHz) and a high oscillation frequency signal with an oscillation frequency F2 (e.g. 10.6 GHz). The first output module 520 includes an IF amplifier 522 and an output buffer 524; the second output module 530 includes an IF amplifier 532 and an output buffer 534. On the other hand, a signal path SL1a is coupled between the low-noise amplifier 502 and the mixer 516, and a conducting state of the signal path SL1a is controlled by the switch SW1a; a signal path SL2a is coupled between the low-noise amplifier 512 and the mixer 506, and a conducting state of the signal path SL2a is controlled by the switch SW2a. Besides, a signal path SL3a is coupled between the IF amplifier 522 and the output buffer 534, and a conducting state of the signal path SL3a is controlled by the switch SW3a; a signal path SL4a is coupled between the IF amplifier 532 and the output buffer 524, and a conducting state of the signal path SL4a is controlled by the switch SW4a.

Figure 6:
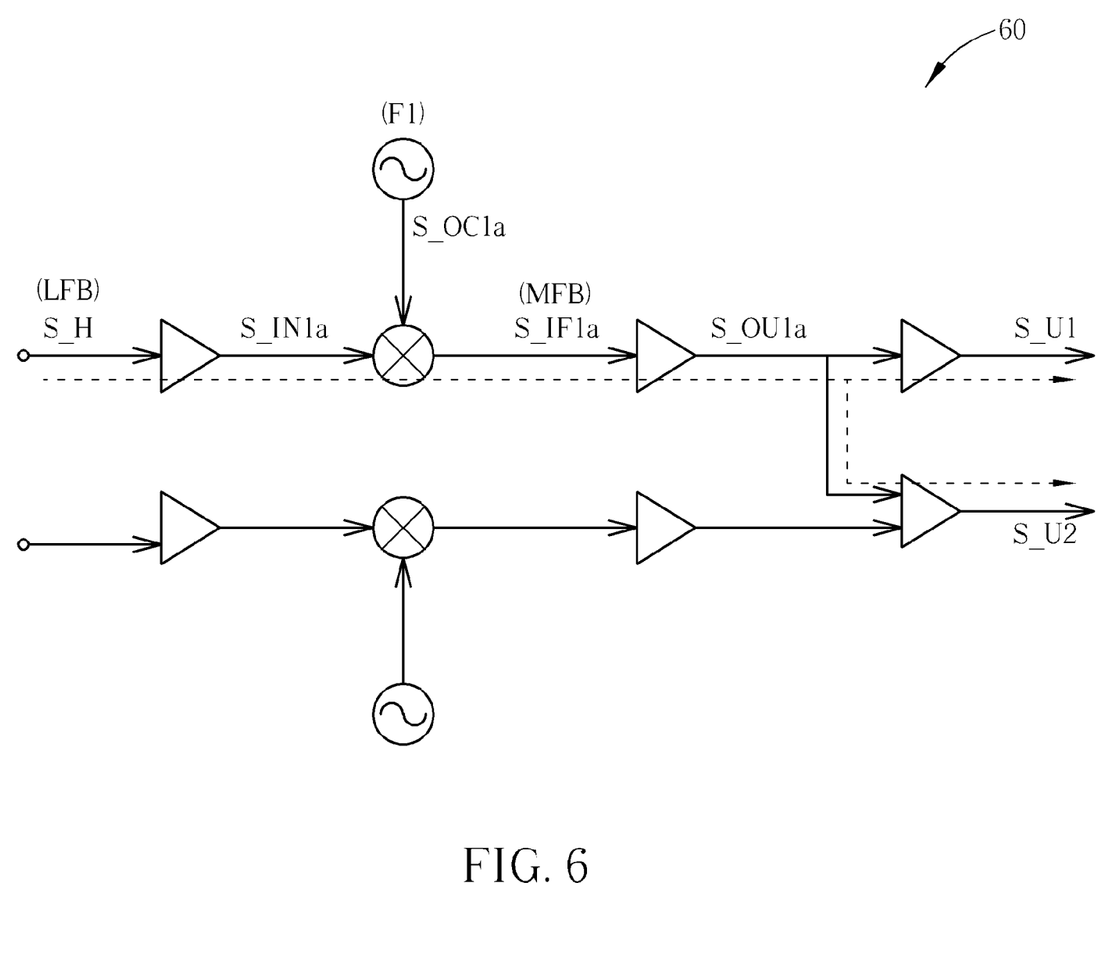
FIG. 6 is a schematic diagram of operations of the low-noise block downconverter shown in FIG. 5.

In detail, for example, the two users both choose the LB horizontal polarization signal. The control unit 24 generates the control signal S_CTR, for controlling the switches SW1a, SW2a and SW4a open and controlling the switch SW3a closed. In this situation, the low-noise amplifier 502 receives the horizontal polarization signal S_H via the input end R1, amplifies the horizontal polarization signal S_H, and correspondingly generates an input signal S_IN1a. The control signal S_CTR also controls the oscillator 504 to generate an oscillation signal S_OC1a with the oscillation frequency F1 (e.g. 9.75 GHz). After the input signals S_IN1a is processed by the mixers 506, the first input module 500 outputs an IF signal S_IF1a at the IF band MFB to the first output module 520. Then, the IF amplifier 522 amplifies the IF signal S_IF1a, and correspondingly generates an output signal S_OU1a. The output signal S_OU1a is transmitted to the output buffer 524, and is also transmitted to the output buffer 534 via the signal path SL3a. The output buffers 524 and 534 amplify the output signal S_OU1a for driving an output impedance, and correspondingly generates the user signal S_U1 and the user signal S_U2, respectively, to the two users. Besides, since the second input module 510 and the IF amplifier 532 are not used for processing and transmitting the polarization signals, the low-noise block downconverter 50 can turn off the second input module 510 and the IF amplifier 532 to reduce power consumption of the low-noise block downconverter 50. For ease of illustration, please refer to FIG. 6, which is a schematic diagram of a low-noise block downconverter 60 according to an example of the present invention. The low-noise block downconverter 60 is used for illustrating operations of the low-noise block downconverter 50 shown in FIG. 5, for example, the corresponding responses of elements and changes of the signal paths after receiving the control signal S_CTR. Elements shown in FIG. 6 are respectively the same as those shown in FIG. 5, and are not narrated herein.

As can be seen from the above, the control unit 24 generates the control signal S_CTR according to the choices of the two users, for controlling the switches SW1a and SW2a to switch conducting states of the signal paths SL1a and SL2a, respectively, and controlling the switches SW3a and SW4a to switch conducting states of the signal paths SL3a and SL4a, respectively. Thus, the signal paths required for transmitting the polarization signals are established. Besides, the control unit 24 turns off elements and modules which are not used for transmitting the polarization signals to reduce the power consumption. Please note that, the above example illustrates that the two users both choose the LB horizontal polarization signal. In practice, the two users can freely choose any of the LB horizontal polarization signal, the HB horizontal polarization signal, the LB vertical polarization signals and the HB vertical polarization signal. Comparing with the example of FIG. 3, the example of FIG. 5 further improves efficiency of the low-noise block downconverter 50 by using the two pairs of the input/output modules and two pairs of the signal paths. Besides, power consumption of the low-noise block downconverter 50 is further reduced by turning off the elements and the modules which are not used for transmitting the polarization signals.

Besides, similar to the low-noise block downconverter 30 of FIG. 3, the elements such as amplifiers and buffers in the low-noise block downconverter 50 of FIG. 5 are simply used for illustrating allocations of corresponding types of the elements. In practice, a number of the same type of the elements can be increased at the same position according to system requirement. On the other hand, additional amplifiers can also be placed on the signal paths SL1a, SL2a, SL3a and SL4a for compensating the path loss coming from long routing traces of the signal paths SL1a, SL2a, SL3a and SL4a to meet system requirement. Realizations and statements mentioned above are ordinary skills in the art. Thus, those skilled in the art should make various alterations and modifications according to system requirement, and is not limited herein.

Please note that, realization of the control unit 24 is not limited, as long as an input of a user can be identified and a corresponding control signal can be generated. For example, in a Ku band satellite receiver, the control unit 24 recognizes that the user chooses a horizontal polarization signal if the input of the user includes a high voltage (e.g. 18-19 volts), and recognizes that the user chooses a vertical polarization signal if the input of the user includes a low voltage (e.g. 13-14 volts). Besides, the control unit 24 recognizes that the user chooses a HB polarization signal if the input of the user includes a 22 KHz tone, and recognizes that the user chooses a LB polarization signal if the input of the user does not include the 22 KHz tone. On the other hand, a switch of a signal path can be realized by allocating an element (e.g. an amplifier) on the signal path. Thus, the signal path is conducting by turning on the element, and is open by turning off the element. For example, a buffer stage can be used for realizing the switch. When a gate bias of the buffer stage is turned on, the signal path conducts; when the gate bias of the buffer stage is turned off, the signal path is open.

On the other hand, when the low-noise block downconverter is used for receiving a Ku band satellite signal, the LB LFB and HB HFB in the present invention refer to frequency bands of 10.7-11.9 GHz and 11.55-12.75 GHz, respectively. In this situation, as long as oscillators can generate oscillation signals with oscillation frequencies of 9.75 GHz and 10.6 GHz according to a control signal S_CTR, a LB polarization signal and a HB polarization signal can both be down-converted into a IF signal at a frequency band MFB of 0.95-2.15 GHz. Therefore, the present invention can use MIMO to handle the Ku band satellite signal. Besides, when oscillators generating oscillation signals with oscillation frequencies of 10.75 GHz and 11.3 GHz are used in the low-noise block downconverter for receiving the Ku band satellite signal, the present invention operates regularly after correspondingly modifying the control signal S_CTR and parameters of the elements. Therefore, the present invention can be used for broadcasting systems with various operating frequencies after appropriate modifications, e.g. changing oscillation frequencies of oscillators and using low-noise amplifiers, mixers, IF amplifiers and output buffers with appropriate passbands.

To sum up, the present invention provides a MIMO low-noise block downconverter and a MIMO low-noise block module, wherein two pairs of input/out modules and one or two pairs of signal paths are installed. Thus, two users can freely choose any of a LB horizontal polarization signal, a HB horizontal polarization signal, a LB vertical polarization signals and a HB vertical polarization signal, which greatly enhances the use efficiency of the low-noise block downconverters. Cost and power consumption of the low-noise block downconverter and a satellite receiver in which the low-noise block downconverter is installed are reduced. Besides, power consumption of the low-noise block downconverter and the satellite receiver is further reduced by turning off elements and modules which are not used for transmitting polarization signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low-noise block downconverter (LNB), comprising:
   a first input module, for outputting a first intermediate frequency (IF) signal;
   a second input module, for outputting a second IF signal;
   a first output module, coupled to the first input module, for amplifying the first IF signal, to output a first user signal to a first user;
   a second output module, coupled to the second input module, for amplifying the second IF signal, to output a second user signal to a second user;
   a first input end, coupled to the first input module, for receiving a first polarization signal; and
   a second input end, coupled to the second input module, for receiving a second polarization signal;
   wherein a first signal path comprising a first switch and a second signal path comprising a second switch, the first switch is coupled between a first IF amplifier of the first output module and a second output stage of the second output module, a second switch is coupled between a second IF amplifier of the second output module and a first output stage of the first output module;
   wherein the first input module further comprises a first oscillator, coupled to a first mixer, for generating a first oscillation signal with a first frequency and a second frequency selectively, and the second input module further comprises a second oscillator, coupled to a second mixer, for generating a second oscillation signal with the first frequency and the second frequency selectively;
   wherein the first mixer selectively outputs a first mixing signal at an IF band after receiving the first polarization signal and the first oscillation signal with the first frequency, and a second mixing signal at the IF band after receiving the first polarization signal and the first oscillation signal with the second frequency; the second mixer selectively outputs a third mixing signal at the IF band after receiving the second polarization signal and the second oscillation signal with the first frequency, and a fourth mixing signal at the IF band after receiving the second polarization signal and the second oscillation signal with the second frequency;
   wherein the first IF amplifier selectively receives one of the first mixing signal and the second mixing signal to output a first output signal, the second IF amplifier selectively receives one of the third mixing signal and the fourth mixing signal to output a second output signal, the first output stage selectively receives the first output signal and the second output signal to output the first user signal, and the second output stage selectively receives the first output signal and the second output signal to output the second user signal;
   wherein the LNB outputs the first user signal and the second user signal simultaneously; and
   wherein the first user signal relates to one of the first mixing signal, the second mixing signal, the third mixing signal and the fourth mixing signal, and the second user signal relates to one of the first mixing signal, the second mixing signal, the third mixing signal and the fourth mixing signal.

2. The low-noise block downconverter of claim 1, wherein the first input module comprises:
   a first low-noise amplifier (LNA), for receiving and amplifying the first polarization signal, to generate a first input signal; and
   the first mixer, coupled between the first low-noise amplifier and the first output module, for mixing the first oscillation signal and the first input signal, to down-convert a frequency band of the first input signal and generate the first IF signal;
   wherein the second input module comprises:
   a second low-noise amplifier, for receiving and amplifying the second polarization signal, to generate a second input signal; and
   the second mixer, coupled between the second low-noise amplifier and the second output module, for mixing the second oscillation signal and the second input signal, to down-convert a frequency band of the second input signal and generate the second IF signal.

3. The low-noise block downconverter of claim 1, wherein the first output module comprises:
   the first IF amplifier, coupled to the first input module, for amplifying the first IF signal, to output the first output signal; and
   the first output stage, coupled to the first IF amplifier, for amplifying the first output signal as the first user signal, to drive an output impedance and output the first user signal to the first user;
   wherein the second output module comprises:
   the second IF amplifier, coupled to the second input module, for amplifying the second IF signal, to output the second output signal; and
   the second output stage, coupled to the second IF amplifier, for amplifying the second output signal as the second user signal, to drive an output impedance and output the second user signal to the second user.

4. The low-noise block downconverter of claim 3, wherein the first output module further comprises:
   the first signal path, coupled between the first IF amplifier and the second output stage, for transmitting the first output signal to the second output stage; and
   the second signal path, coupled between the second IF amplifier and the first output stage, for transmitting the second output signal to the first output stage.

5. The low-noise block downconverter of claim 4, wherein the first signal path comprises the first switch, for switching a conducting state of the first signal path, and the second signal path comprises the second switch, for switching a conducting state of the second signal path.

6. The low-noise block downconverter of claim 5, wherein the first switch and the second switch are buffer stages, and operations of the buffer stages are controlled by gate bias of the buffer stages, respectively.

7. The low-noise block downconverter of claim 1, wherein the first polarization signal is a vertical polarization signal, and the second polarization signal is a horizontal polarization signal.

8. A low-noise block module, comprising:
a low-noise block downconverter (LNB), comprising:
   a first input module, for outputting a first intermediate frequency (IF) signal;
   a second input module, for outputting a second IF signal;
   a first output module, coupled to the first input module via a first connection node, for amplifying the first IF signal, to output a first user signal to a first user;
   a second output module, coupled to the second input module via a second connection node, for amplifying the second IF signal, to output a second user signal to a second user;
   a first input end, coupled to the first input module, for receiving a first polarization signal; and
   a second input end, coupled to the second input module, for receiving a second polarization signal;
   wherein a first signal path comprising a first switch and a second signal path comprising a second switch, the first switch is coupled between a first IF amplifier of the first output module and a second output stage of the second output module, a second switch is coupled between a second IF amplifier of the second output module and a first output stage of the first output module;
   wherein the first input module further comprises a first oscillator, coupled to a first mixer, for generating a first oscillation signal with a first frequency and a second frequency selectively, and the second input module further comprises a second oscillator, coupled to a second mixer, for generating a second oscillation signal with the first frequency and the second frequency selectively;
   wherein the first mixer selectively outputs a first mixing signal at an IF band after receiving the first polarization signal and the first oscillation signal with the first frequency, and a second mixing signal at the IF band after receiving the first polarization signal and the first oscillation signal with the second frequency; the second mixer selectively outputs a third mixing signal at the IF band after receiving the second polarization signal and the second oscillation signal with the first frequency, and a fourth mixing signal at the IF band after receiving the second polarization signal and the second oscillation signal with the second frequency;
   wherein the first IF amplifier selectively receives one of the first mixing signal and the second mixing signal to output a first output signal, the second IF amplifier selectively receives one of the third mixing signal and the fourth mixing signal to output a second output signal, the first output stage selectively receives the first output signal and the second output signal to output the first user signal, and the second output stage selectively receives the first output signal and the second output signal to output the second user signal;
   wherein the LNB outputs the first user signal and the second user signal simultaneously; and
   wherein the first user signal relates to one of the first mixing signal, the second mixing signal, the third mixing signal and the fourth mixing signal, and the second user signal relates to one of the first mixing signal, the second mixing signal, the third mixing signal and the fourth mixing signal; and
a control unit, for generating a control signal to the low-noise block downconverter according to inputs of the first user and the second user, to control conducting states of the first signal path and the second signal path, and operations of the first input module, the second input module, the first output module and the second output module, to reduce power consumption of the low-noise block downconverter.

9. A low-noise block downconverter (LNB), comprising:
a first input module, for outputting a first intermediate frequency (IF) signal;
a second input module, for outputting a second IF signal;
a first output module, coupled to the first input module, for amplifying the first IF signal, to output a first user signal to a first user;
a second output module, coupled to the second input module, for amplifying the second IF signal, to output a second user signal to a second user;
a first input end, coupled to the first input module, for receiving a first polarization signal; and
a second input end, coupled to the second input module, for receiving a second polarization signal;
wherein a first signal path comprising a first switch and a second signal path comprising a second switch are coupled between the first input module and the second input module, the second switch is coupled to between the second input end and an input end of a first mixer of the first input module, and the first switch is coupled to between the first input end and an input end of a second mixer of the second input module, the first user signal relates to the first polarization signal or the second polarization signal, and the second user signal relates to the first polarization signal or the second polarization signal;
wherein the first input module outputs the first IF signal after receiving one of the first polarization signal via the first input end of the LNB and the second polarization signal via the second signal path selectively, and the second input module outputs the second IF signal after receiving one of the second polarization signal via the second input end of the LNB and the first polarization signal via the first signal path selectively;
wherein the LNB outputs the first user signal and the second user signal simultaneously;
wherein the first input module further comprises a first oscillator, coupled to the first mixer, for generating a first oscillation signal with at least one of a first frequency and a second frequency selectively, and the second input module further comprises a second oscillator, coupled to the second mixer, for generating a second oscillation signal with at least one of the first frequency and the second frequency selectively;
wherein the first mixer selectively outputs a first mixing signal at an IF band after receiving the first polarization signal and the first oscillation signal with the first frequency, a second mixing signal at the IF band after receiving the first polarization signal and the first oscillation signal with the second frequency, a third mixing signal at the IF band after receiving the second polarization signal and the first oscillation signal with the first frequency, and a fourth mixing signal at the IF band after receiving the second polarization signal and the first oscillation signal with the second frequency; the second mixer selectively outputs the first mixing signal at the IF band after receiving the first polarization signal and the second oscillation signal with the first frequency, the second mixing signal at the IF band after receiving the first polarization signal and the second oscillation signal with the second frequency, the third mixing signal at the IF band after receiving the second polarization signal and the second oscillation signal with the first frequency, and the fourth mixing signal at the IF band after receiving the second polarization signal and the second oscillation signal with the second frequency; and wherein the first IF signal comprises one of the first mixing signal, the second mixing signal, the third mixing signal, and the fourth mixing signal; and the second IF signal comprises one of the first mixing signal, the second mixing signal, the third mixing signal, and the fourth mixing signal;

wherein the first input end is temporarily coupled to both the first mixer and the second mixer to simultaneously send the first polarization signal to both the first mixer and the second mixer;

wherein the second input end is temporarily coupled to both the first mixer and the second mixer to simultaneously send the second polarization signal to both the first mixer and the second mixer.

10. The low-noise block downconverter of claim 9, wherein the first input module comprises:
   a first low-noise amplifier (LNA), for receiving and amplifying the first polarization signal, to generate a first input signal; and
   the first mixer, coupled between the first low-noise amplifier and the first output module, for mixing the first oscillation signal and the first input signal, to down-convert a frequency band of the first input signal and generate the first IF signal;
wherein the second input module comprises:
   a second low-noise amplifier, for receiving and amplifying the second polarization signal, to generate a second input signal; and
   the second mixer, coupled between the second low-noise amplifier and the second output module, for mixing the second oscillation signal and the second input signal, to down-convert a frequency band of the second input signal and generate the second IF signal.

11. The low-noise block downconverter of claim 10, wherein the first signal path is coupled between the first input end and the second low-noise amplifier, for transmitting the first polarization signal to the second low-noise amplifier, and the second signal path is coupled between the second input end and the first low-noise amplifier, for transmitting the second polarization signal to the first low-noise amplifier.

12. The low-noise block downconverter of claim 10, wherein the first signal path is coupled between the first low-noise amplifier and the second mixer, for transmitting the first input signal to the second mixer, and the second signal path is coupled between the second low-noise amplifier and the first mixer, for transmitting the second input signal to the first mixer.

13. The low-noise block downconverter of claim 9, wherein the first switch is disposed for switching a conducting state of the first signal path, and the second switch is disposed for switching a conducting state of the second signal path.

14. The low-noise block downconverter of claim 13, wherein the first switch and the second switch are buffer stages, and operations of the buffer stages are controlled by gate bias of the buffer stages, respectively.

15. The low-noise block downconverter of claim 9, wherein the first output module comprises:
   a first IF amplifier, coupled to the first input module, for amplifying the first IF signal, to output a first output signal; and
   a first output stage, coupled to the first IF amplifier, for amplifying the first output signal as the first user signal, to drive an output impedance and output the first user signal to the first user;
wherein the second output module comprises:
   a second IF amplifier, coupled to the second input module, for amplifying the second IF signal, to output a second output signal; and
   a second output stage, coupled to the second IF amplifier, for amplifying the second output signal as the second user signal, to drive an output impedance and output the second user signal to the second user.

16. The low-noise block downconverter of claim 15, wherein the first output module further comprises:
   a third signal path, coupled between the first IF amplifier and the second output stage, for transmitting the first output signal to the second output stage; and
   a fourth signal path, coupled between the second IF amplifier and the first output stage, for transmitting the second output signal to the first output stage.

17. The low-noise block downconverter of claim 16, wherein the third signal path comprises a third switch, for switching a conducting state of the third signal path, and the fourth signal path comprises a fourth switch, for switching a conducting state of the fourth signal path.

18. The low-noise block downconverter of claim 17, wherein the third switch and the fourth switch are buffer stages, and operations of the buffer stages are controlled by gate bias of the buffer stages, respectively.

19. The low-noise block downconverter of claim 9, wherein the first polarization signal is a vertical polarization signal, and the second polarization signal is a horizontal polarization signal.

* * * * *